United States Patent
Bauchot et al.

(10) Patent No.: US 10,027,345 B2
(45) Date of Patent: Jul. 17, 2018

(54) WALL ENCODING AND DECODING

(71) Applicant: International Business Machines Corporation, Armonk, NY (US)

(72) Inventors: Frederic J. Bauchot, Saint-Jeannet (FR); Graham Butler, Berkshire (GB); Marc Peters, St. Vith (BE)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 14/947,123

(22) Filed: Nov. 20, 2015

(65) Prior Publication Data

US 2016/0179859 A1 Jun. 23, 2016

(30) Foreign Application Priority Data

Dec. 19, 2014 (GB) .................................... 1422714.4

(51) Int. Cl.
| | |
|---|---|
| *H03M 7/00* | (2006.01) |
| *H03M 5/14* | (2006.01) |
| *H03M 7/14* | (2006.01) |

(52) U.S. Cl.
CPC .............. *H03M 5/14* (2013.01); *H03M 7/00* (2013.01); *H03M 7/14* (2013.01)

(58) Field of Classification Search
None
See application file for complete search history.

(56) References Cited

U.S. PATENT DOCUMENTS

| | | | | |
|---|---|---|---|---|
| 4,346,353 A | * | 8/1982 | Scholz ................ | H04L 25/4904 341/50 |
| 4,555,805 A | | 11/1985 | Talbot | |

(Continued)

FOREIGN PATENT DOCUMENTS

| | | |
|---|---|---|
| CN | 102025482 A | 4/2011 |
| CN | 103023653 A | 4/2013 |

(Continued)

OTHER PUBLICATIONS

U.S. Appl. No. 15/437,500, Notice of Allowance dated Apr. 5, 2017, 17 pages.

(Continued)

*Primary Examiner* — Howard Williams
(74) *Attorney, Agent, or Firm* — Daniel Simek; Hoffman Warnick LLC

(57) ABSTRACT

The encoding of an input string of binary characters includes: a register storing a cellular data structure definition including a starting empty cell; a register storing a group cell structure definition for a valid brick formation; a brick validation engine testing data structure at a current cell beginning with the starting empty cell for an invalid brick formation; a character reading/writing engine writing, if the empty cell is not invalid, a binary character from the input string to the empty cell and writing, if the empty cell is invalid, a dummy value to the empty cell; a loop facilitator looping back through the testing and writing steps with a next data character and a next empty cell until there are no more data characters; and a serialization de-serialization engine methodically serializing the data structure into a one dimensional binary string of characters representing an encoded string of alphanumeric characters.

17 Claims, 18 Drawing Sheets

(56) References Cited

U.S. PATENT DOCUMENTS

| | | | |
|---|---|---|---|
| 4,602,282 A | | 7/1986 | Kurono et al. |
| 4,602,283 A | * | 7/1986 | Corgnier ............. G06F 12/0207 370/503 |
| 6,014,733 A | | 1/2000 | Bennett |
| 6,737,994 B2 | | 5/2004 | Davis et al. |
| 6,876,774 B2 | | 4/2005 | Satoh et al. |
| 7,327,293 B2 | | 2/2008 | Foster |
| 8,311,222 B2 | | 11/2012 | Rawson, Sr. |
| 8,340,162 B2 | | 12/2012 | Tzannes |
| 8,467,533 B2 | | 6/2013 | Hammersmith |
| 8,670,560 B2 | | 3/2014 | Cheddad et al. |
| 8,687,810 B2 | | 4/2014 | Bukshpun et al. |
| 9,350,382 B1 | | 5/2016 | Bauchot et al. |
| 9,425,825 B2 | | 8/2016 | Bauchot et al. |
| 9,473,167 B2 | | 10/2016 | Bauchot et al. |
| 9,647,681 B2 | | 5/2017 | Bauchot et al. |
| 2003/0118186 A1 | | 6/2003 | Gilley |
| 2009/0063431 A1 | | 3/2009 | Erol et al. |
| 2009/0100048 A1 | | 4/2009 | Hull et al. |
| 2010/0281256 A1 | | 11/2010 | Farrugia et al. |
| 2012/0011360 A1 | | 1/2012 | Engels et al. |
| 2012/0082310 A1 | | 4/2012 | Rashkovskiy et al. |
| 2013/0232305 A1 | | 9/2013 | Cuthberth, II et al. |
| 2014/0105382 A1 | | 4/2014 | Liu |

FOREIGN PATENT DOCUMENTS

| | | |
|---|---|---|
| CN | 103684742 A | 3/2014 |
| EP | 0089632 A1 | 9/1983 |
| EP | 0304217 A2 | 2/1989 |
| EP | 0445290 B1 | 3/1997 |
| GB | 1295572 | 11/1972 |
| WO | 2010046104 A2 | 4/2010 |
| WO | 2014082090 A1 | 5/2014 |

OTHER PUBLICATIONS

U.S. Appl. No. 14/947,101, Notice of Allowance dated May 10, 2016, 13 pages.

U.S. Appl. No. 15/422,526, Notice of Allowance dated Sep. 12, 2017, 8 pages.

U.S. Appl. No. 15/422,526, Office Action 1 dated Jul. 19, 2017, 18 pages.

Computer Security CS 426 Lecture 3, "Cryptography: One time Pad, Information Theoretical Security, and Stream Clphers," Fall 2010, 19 pages, CS426, URL:https://www.cs.purdue.edu/homes/ninghui/courses/426_Fall10/_lect03.pdf.

Great Britain Intellectual Property Office, Search Report under Section 17(5), for Application No. GB1422719.3, completed Jul. 3, 2015, 3 pages.

Great Britain Intellectual Property Office, Search Report under Section 17(5), for Application No. GB1422717.7 completed Jul. 3, 2015, 3 pages.

Great Britain Intellectual Property Office, Search Report under Section 17(5), for Application No. GB1422717.4 completed Jul. 19, 2015, 4 pages.

Bhattasali, "LICRYPT: Lightweight Cryptography Technique for Securing Smart Objects in Internet of Things Environment," May 2013, 3 pages, CSI Communications, www.csi-india.org.

Internet Archive WaybackMachine, rick's blog, "Stream Clipers," Jun. 2007, 8 pages, Cryptosmith, Security, Tech Teaching, http://cryptosmith.com/2007/06/07/stream-ciphers/.

Wikipedia, the free encyclopedia, "One-time pad," retrieved from https://en.wikipedia.org/wiki/one-time_pad/, Aug. 2015, 6 pages.

Wikipedia, the free encyclopedia, "Sinc filter," retrieved from https://en.wikipedia.org/wiki/Sinc_filter/, Aug. 2015, 2 pages.

U.S. Appl. No. 15/184,306, Office Action 1 dated Aug. 30, 2016, 19 pages.

U.S. Appl. No. 15/184,306, Notice of Allowance dated Oct. 12, 2016, 7 pages.

U.S. Appl. No. 15/248,272, Office Action 1 dated Nov. 3, 2016, 16 pages.

U.S. Appl. No. 15/248,272, Notice of Allowance dated Jan. 4, 2017, 21 pages.

U.S. Appl. No. 15/358,909, Notice of Allowance dated Jan. 20, 2017, 21 pages.

U.S. Appl. No. 15/248,272, Notice of Allowance dated Jan. 4, 2017, 10 pages.

Nguyen, Notice of Allowance and Fee(s) Due for U.S. Appl. No. 14/947,068, dated Mar. 3, 2016, 13 pages.

U.S. Appl. No. 15/086,246 Office Action 1 dated Jun. 3, 2016, 18 pages.

U.S. Appl. No. 15/086,246, Notice of Allowance dated Jul. 12, 2016, 9 pages.

* cited by examiner

Wall Encoding and Decoding Module 200

Cellular Space Definition Data 202

Wall Definition Data 203

Character Reading and Writing Engine 204

Brick Validation Engine 206

Loop Facilitator 208

Serialization De-serialization Engine 210

Wall Encoding Method 300

Wall Decoding Method 400

FIGURE 2

Wall Encoding Method 300

302 Defining a cellular data structure and brick including an empty starting current cell

304 Testing data structure at an empty cell beginning with the empty starting cell with binary values for invalid brick formation

NO

YES

306 Writing input string value into current cell of data structure. Update cell status and update input string index.

308 Updating cell value with dummy value

310 If valid brick built then update respective cell status to brick

312 Input string finished? — NO → 314 Incrementing cell index

YES

316 Methodically serializing the cellular space into a one dimensional binary string of characters representing an encoded string of alphanumeric characters. (Randomize remaining dummy values)

FIGURE 3A

Wall Decoding Method 400

402 Defining a cellular data structure including an empty starting current cell and a brick definition

403 Methodically filling the data structure with a binary string of characters representing an encoded string of alphanumeric characters. All cell status are busy.

404 Testing data structure at an empty cell beginning with the empty starting cell with binary values for invalid brick formation NO → 406 Writing current cell of data structure into output string. Update cell status to idle and update index.

YES → 408 Updating cell value with dummy value

410 If valid brick built then update brick cell status to "bordered"

412 Input string finished?

NO → 414 Incrementing cell index

YES → 416 End

Wall, as built for coding

| - | - | - | - | 0 | 0 | 0 | 1 |
|---|---|---|---|---|---|---|---|
| 0 | 0 | 1 | 1 | 0 | 1 | 0 | x |
| 1 | x | 0 | x | 1 | x | x | x |
| x | 1 | 1 | 0 | 0 | x | x | x |
| 0 | 0 | 0 | 0 | 1 | x | x | 0 |
| 0 | 1 | 0 | 0 | 0 | 1 | 1 | x |
| x | x | 0 | 1 | 0 | 0 | x | x |
| x | x | 0 | x | 1 | x | x | x |
| x | x | x | 0 | x | x | 0 | 1 |
| 1 | 0 | 1 | 0 | 0 | 1 | x | x |
| x | x | x | 0 | x | x | x | x |
| x | x | x | 1 | x | x | x | x |
| x | x | 1 | z | z | z | z | z |

FIGURE 7A

```
LENGTH = 48
WIDTH = 8
START = 5
BRICK SET = {SIZE > = 4}
```

FIGURE 7B

```
Input string
1357024689AB
Output string: Reading by row
9135D8E20A4710592DA748BD78
Output string: Reading by column
B051A95437C6329BA2687118BA
Output string: Reading by diagonal
93D462601499236EA09C9EEF42
```

Wall, as built for coding

| x | x | x | x | 0 | 0 | 0 | 1 |
|---|---|---|---|---|---|---|---|
| 0 | 0 | 1 | 1 | 0 | 1 | 0 | x |
| 1 | x | 0 | x | 1 | x | x | x |
| x | 1 | 1 | 0 | 0 | x | x | x |
| 0 | 0 | 0 | x | x | x | x | 0 |
| 1 | 0 | 0 | x | x | 1 | 0 | x |
| x | 0 | x | x | 0 | x | 1 | x |
| x | 1 | x | x | x | 0 | x | 1 |
| 0 | 0 | 0 | 1 | 0 | 0 | 1 | x |
| 1 | 0 | 1 | x | 0 | x | 1 | 0 |
| x | 1 | x | x | 1 | x | x | x |

FIGURE 9A

```
LENGTH = 48
WIDTH = 8
START = 5
BRICK SET = {SIZE = 4}
```

FIGURE 9B

```
Input string
1357024689AB
Output string: Reading by row
F135CE62108496FB12B6CD
Output string: Reading by column
A776274565E212CCCCF609
Output string: Reading by diagonal
B5D54469543B294F890BF1
```

FIGURE 9C

Wall, as built for coding

| x | x | x | x | 0 | 0 | 0 | 1 |
|---|---|---|---|---|---|---|---|
| 0 | 0 | 1 | 1 | 0 | 1 | 0 | x |
| 1 | x | 0 | x | x | x | x | x |
| x | 1 | x | 1 | x | x | x | 1 |
| 0 | 0 | x | x | 0 | 0 | 0 | x |
| 0 | 1 | 0 | x | 0 | 1 | 0 | x |
| x | x | x | 0 | x | x | x | 0 |
| x | x | 1 | 1 | x | x | 0 | 1 |
| 0 | 0 | 0 | x | 1 | 0 | x | x |
| 0 | 1 | 1 | 0 | x | 1 | 0 | x |
| x | 1 | 0 | x | 1 | 1 | x | x |

FIGURE 10A

```
LENGTH = 48
WIDTH = 8
START = 5
BRICK SET = {SIZE >= 3}
```

FIGURE 10B

```
Input string
1357024689AB
Output string: Reading by row
613599F91045A6390A64CC
Output string: Reading by column
32328F4D3C831A8CC0A7A8
Output string: Reading by diagonal
369466E192121AB62C38E0
```

FIGURE 10C

Wall, as built for coding

| x | x | x | x | x | x | 0 | 0 | 0 |
|---|---|---|---|---|---|---|---|---|
| 1 | 0 | 0 | 1 | 1 | 0 | 1 | 0 | 1 |
| x | 0 | 1 | 1 | x | x | x | x | x |
| x | 1 | 0 | 0 | x | x | x | x | x |
| 0 | x | 0 | 0 | 0 | 1 | 0 | 0 | 1 |
| x | x | 0 | 0 | 0 | x | 1 | x | x |
| x | 1 | 0 | 1 | x | 0 | 0 | 0 | x |
| 1 | x | x | x | 0 | 0 | 1 | x | 1 |
| 0 | 1 | x | x | 0 | 1 | x | 0 | x |
| x | x | 1 | 1 | x | x | x |   |   |

FIGURE 11A

```
LENGTH = 48
WIDTH = 9
START = 7
BRICK SET = {SIZE >= 3}
```

FIGURE 11B

```
Input string
1357024689AB
Output string: Reading by row
D84D6CF954483743C7645C
Output string: Reading by column
F366E21F89D043275084FE
Output string: Reading by diagonal
F25EB40CA427BD262C3D32
```

FIGURE 11C

Wall, as built for coding

| x | x | x | x | 0 | 0 | 0 | 1 |
|---|---|---|---|---|---|---|---|
| 0 | 0 | 1 | 1 | 0 | 1 | x | x |
| 0 | 1 | 0 | 1 | x | x | 1 | 1 |
| x | x | x | x | 0 | 0 | 0 | 0 |
| 0 | 0 | 1 | 0 | 0 | 1 | 0 | 0 |
| 0 | 1 | x | 1 | 0 | x | 1 | 0 |
| x | x | 0 | x | x | 0 | x | x |
| 1 | 0 | x | 0 | 1 | x | 1 | 0 |
| x | x | 1 | x | x | 0 | x | x |
| 1 | 0 | x | 1 | 1 | x | x | x |

FIGURE 12A

```
LENGTH = 48
WIDTH = 8
START = 5
BRICK SET = {SIZE = 2}
```

FIGURE 12B

```
Input string
1357024689AB
Output string: Reading by row
0136535024768B8A68BC
Output string: Reading by column
034D24CDD103D3167288
Output string: Reading by diagonal
019427AA312C55956AE0
```

Wall, as built for coding

FIGURE 13B

LENGTH = 48
WIDTH = 6/8/10
START = 5
BRICK SET = {SIZE >= 3}

FIGURE 13C

Input string
1357024689AB
Output string: Reading by row
D135B830D86E080B5853EB1F
Output string: Reading by column
F2AA1660AE1D093581157CBB
Output string: Reading by diagonal
D8F9A4080CD06F02DD84397F

WALL ENCODING AND DECODING

TECHNICAL FIELD

The invention relates to a method and apparatus for encoding and decoding data. In particular, the invention relates to a method and apparatus for encoding and decoding data using a wall in a data structure made up of cells.

BACKGROUND

The trend for encoding and decoding text is to use ever more complex algorithms. To this extent, increasing processing power is required to encode and decode.

Mobile devices often have more constrained resources than a desktop counterpart but often mobile applications only need a low level of encoding. For instance, field sensors and actuators would benefit from a system which presents a good trade-off between: reduced power consumption; computer resource; and security strength.

SUMMARY

In a first aspect there is provided a system of encoding an input string of binary characters, comprising: a cellular data structure definition including a starting empty cell; a group cell structure definition for a valid brick formation; a brick validation engine for testing data structure at a current cell beginning with the starting empty cell for an invalid brick formation; a character reading and writing engine for writing, if the empty cell is not invalid, a binary character from the input string to the empty cell and writing, if the empty cell is invalid, a dummy value to the empty cell; a loop facilitator for looping back through the testing and writing steps with a next data character and a next empty cell until there are no more data characters; and a serialization de-serialization engine for methodically serializing the data structure into a one dimensional binary string of characters representing an encoded string of alphanumeric characters.

In a second aspect there is provided a method of encoding an input string of binary characters, comprising: defining a cellular data structure, a wall, including a starting empty cell; defining a group cell structure for a valid brick formation; testing data structure at a current cell beginning with the starting empty cell for an invalid brick formation; writing, if empty cell is not invalid, a binary character from the input string to the empty cell; writing, if empty cell is invalid, a dummy value to the empty cell; looping back through the testing and writing steps with a next data character and a next empty cell until there are no more data characters; and methodically serializing the data structure into a one dimensional binary string of characters representing an encoded string of alphanumeric characters.

The cellular data structure is a wall comprising bricks. A brick comprises a particular grouping of cells having the same value.

In an embodiment the input string is binary characters that represent a string of alphanumeric characters. In other embodiments the characters in the input string could be any number base representing another string of a higher number base.

The wall is populated bit by bit from the input string in the same sequence as the input bits in the input string.

In an embodiment the current cell (also known as a current position (CP)) is initially set to the starting empty cell (also known as starting point (start)), and then moves along the rows, incrementing one step. At each step, the value for the current position CP is derived and filled in accordance with the following rules: if both values "0" and "1" do not create an invalid brick, then the $n^{th}$ input bit IS(n) is filled in the wall; if "0" creates an invalid brick, then a dummy value x (representing a "1") is filled in the wall; and if "1" creates an invalid brick, then a dummy value x (representing a "0") is filled in the wall.

After each step to fill the wall (with either "0" or "1" or "x" where "x" represents a dummy character), any valid brick that is formed is fenced or bordered or somehow indicated as a collection of cells rather than distinct cells. Then CP then moves to the next position along the wall row(s).

When all the input bits are placed in the wall, padding bits (dummy value x) may be added, for example, to simplify hexadecimal encoding. The undetermined bits at the beginning of the wall, before the starting point (start) are also filled with a dummy value x.

The output bit string is determined by reading the wall in accordance with a READ_ORDER and each dummy value x is replaced with a random value "0" or "1". The coded output string (OS) is made from the sequence of wall rows.

Several options for alternate embodiments are listed below, these options can be combined to form further embodiments. A brick can be defined to evolve over the encoding process. For instance, start with ten trimino bricks (three cell bricks), then ten tetramino bricks (four cell bricks) and loop again. A three dimensional wall with bricks visiting the three dimensions is envisaged. One encoding embodiment could use successive iterations of the wall coding, with different parameters at each run and optionally combined with other encoding schemes. Another option is to use an alternative set of parameters for wall shape, brick definition, start, length, read order for each successive encoding/decoding based on an encrypted instruction derived through utilisation of the random bit string generated from the dummy values x and padding bits to identify the parameters to be used in the subsequent transmission. This should also enable standard programming to be included in shipped devices with the first parameters being instructed from the back end system during commissioning.

The width of a wall is envisaged to vary from eight cells to thirty two cells. The start position is envisaged to vary from one to thirty two cells. The brick set may also vary the size of the bricks over the course of encoding. Furthermore padding bits may be introduced for further encoding quality. A further embodiment is envisaged whereby a sequence of walls is used to encode longer strings and moreover different wall formats could be used within that sequence. A further embodiment is envisaged whereby a string is encoded using one wall format and/or brick size and then re-encoded using one or more further variations.

The group cell structure definition for a valid brick formation requires cell values for a brick to have the same value.

The group cell structure definition for a valid brick formation comprises a condition for the number of cells in a brick. For instance, the number of cells could be two, three, four, more than four, or between two and four.

The embodiments that populate the wall with bricks involve non-complex logical testing and as a consequence deliver results with low resource utilization. The embodiments do not require conventional and demanding encoding techniques. The embodiments do not require dedicated hardware assistance. The embodiments deliver without requiring either high computing power or high memory space. The embodiments are robust as the large diversity of cellular definitions result in a significant number of possible output strings for any given input string.

The dummy cell values may be randomized before serialization.

The data structure is an array and the dimensions include length and width.

More advantageously the cellular definition includes the order and path in which the cells of the cellular data structure are written to and read from.

Still more advantageously further comprising updating cells status when a valid brick has been formed.

According to a third aspect there is provided a method of decoding an input string of binary characters representing an encoded string of alphanumeric characters, comprising: receiving a cellular data structure definition; a starting empty cell; a group cell definition for a valid brick formation and a de-serializing method; de-serializing a binary string of characters representing the encoded string of alphanumeric characters into the cellular data structure using the de-serializing method; testing data structure at a current cell beginning with the starting empty cell for an invalid brick formation; reading, if the empty cell is not invalid, a binary character from the empty cell to an output string; and looping back through the testing and reading steps with a next empty cell until there are no more data characters.

In a fourth aspect there is provided a computer program product comprising a computer-readable storage medium having computer-readable program code embodied therewith, the computer-readable program code configured to perform a method for encoding an input string of binary characters representing alphanumeric characters when executed by a computer system, the method comprising: defining a group cell structure for a valid brick formation; testing data structure at a current cell beginning with the starting empty cell for an invalid brick formation; writing, if empty cell is not invalid, a binary character from the input string to the empty cell; writing, if empty cell is invalid, a dummy value to the empty cell; looping back through the testing and writing steps with a next data character and a next empty cell until there are no more data characters; and methodically serializing the data structure into a one dimensional binary string of characters representing an encoded string of alphanumeric characters.

The computer program product comprises a series of computer-readable instructions either fixed on a tangible medium, such as a computer readable medium, for example, optical disk, magnetic disk, solid-state drive or transmittable to a computer system, using a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, preloaded with a computer system, for example, on a system ROM or fixed disk, or distributed from a server or electronic bulletin board over a network, for example, the Internet or World Wide Web.

BRIEF DESCRIPTION OF THE DRAWINGS

Embodiments of the present invention will now be described, by way of example only, with reference to the following drawings.

FIG. 2 is a component diagram of an embodiment.

FIG. 3A is a flow diagram of a process of the encoding method.

FIG. 4A is a flow diagram of a process of the decoding method.

FIGS. 6A, 6B and 6C is a table showing how an example input stream of twenty binary characters is written into a wall step by step.

FIGS. 7A, 7B, 7C and 7D are respectively: an example wall after writing an example input string; a table showing example initial parameters used to code the example wall; a table showing the example input string and three different possible output strings for the example; and a table showing the binary characters from the wall making up the three possible output strings.

Figures 8A, 8B, 8C, 8D:
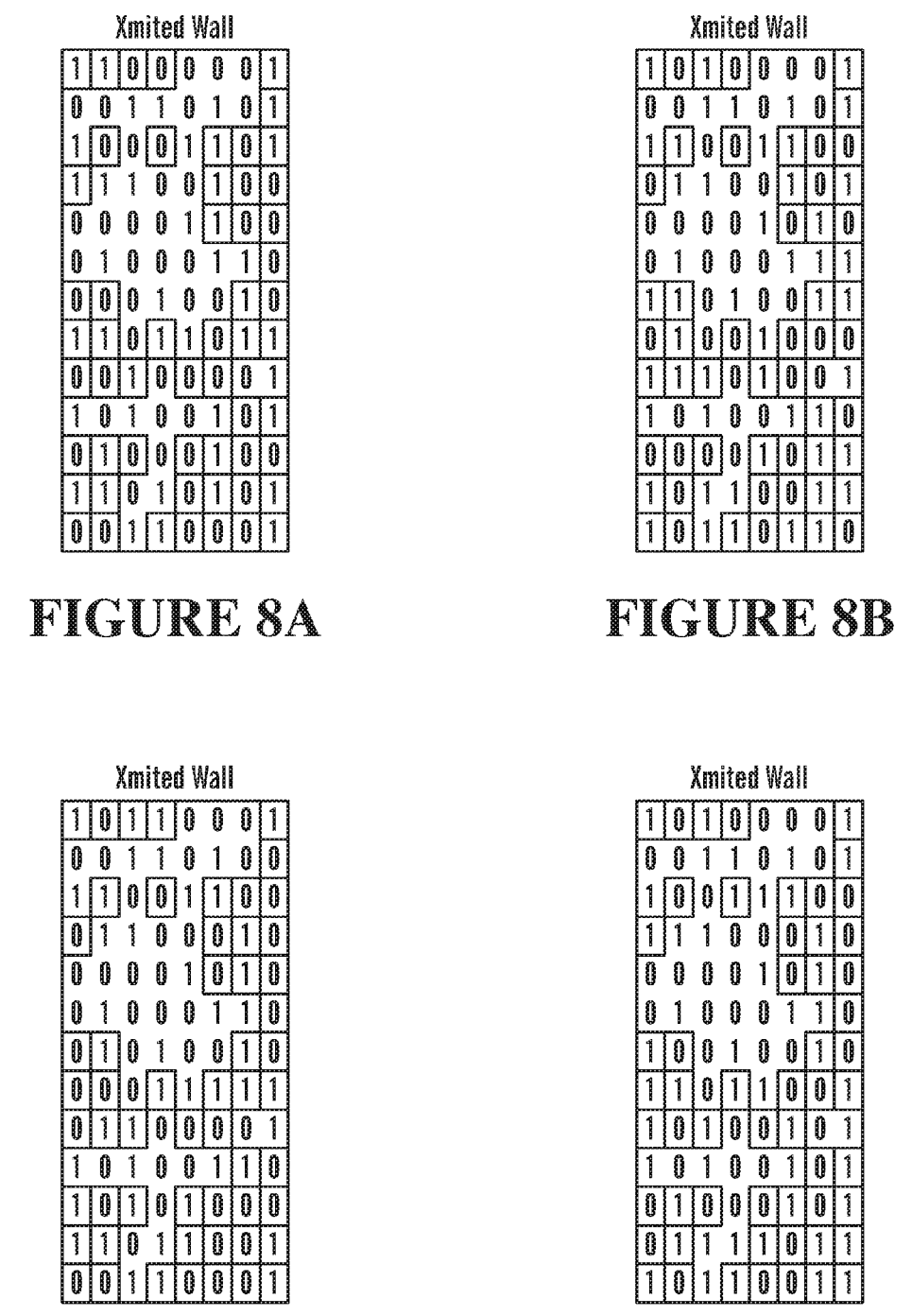

FIGS. 8A; 8B; 8C and 8D show four different transmitted tables of the same output string.

FIGS. 9A, 10A, 11A, 12A and 13A are different examples of a wall after writing an input string.

FIGS. 9B, 10B, 11B, 12B and 13B are respective examples of a table showing initial parameters used to code the example walls.

FIGS. 9C, 10C, 11C, 12C and 13C are respective example of a table showing the input string and three different possible output strings.

DETAILED DESCRIPTION

Figure 1:
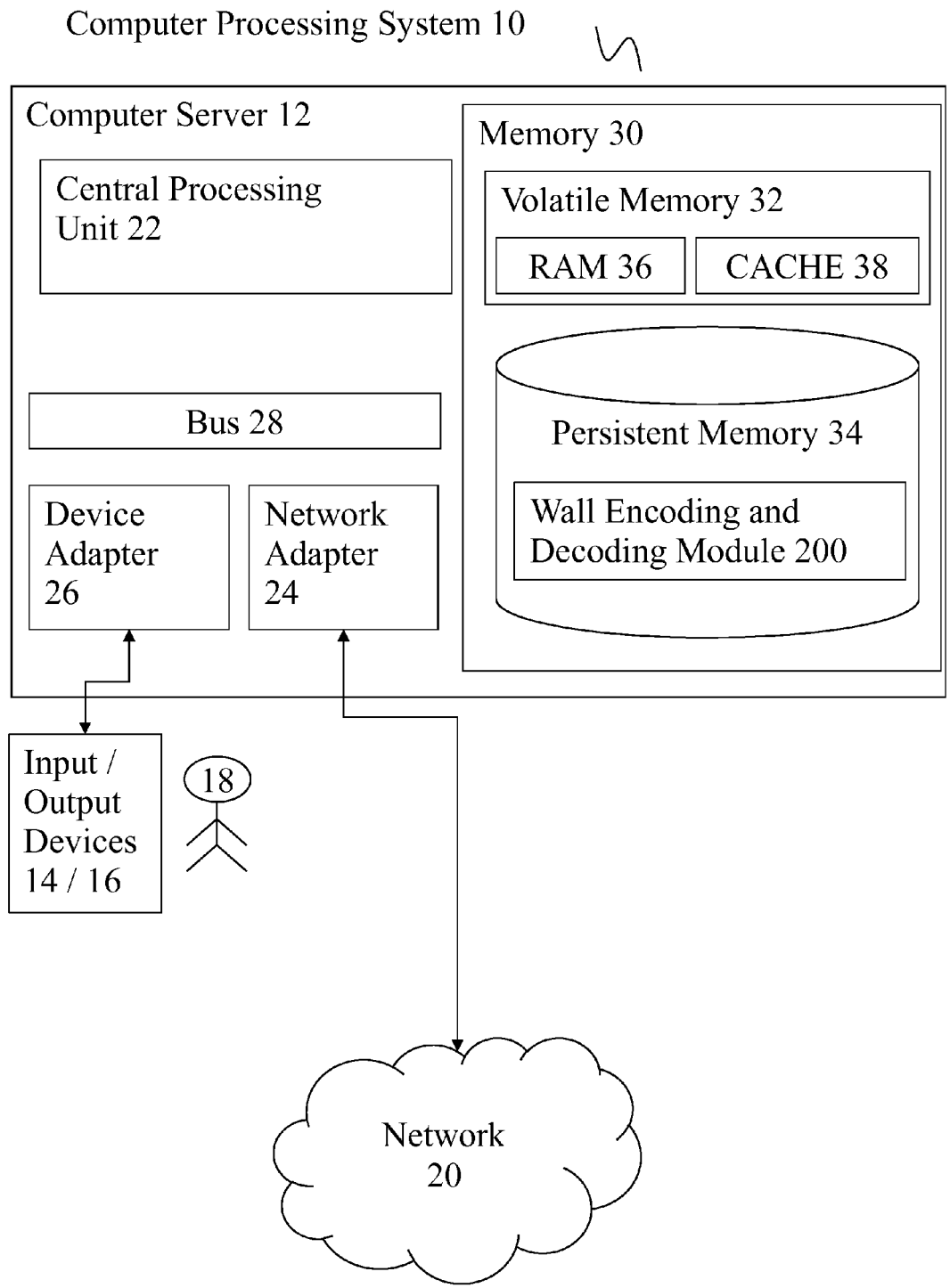
FIG. 1 is a deployment diagram of an embodiment.

Referring to FIG. 1, the deployment of an embodiment in computer processing system 10 is described. Computer processing system 10 is operational with numerous other general purpose or special purpose computing system environments or configurations. Examples of well-known computing processing systems, environments, and/or configurations that may be suitable for use with computer processing system 10 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, programmable industrial devices, and distributed computing environments that include any of the above systems or devices. A distributed computer environment includes a cloud computing environment for example where a computer processing system is a third party service performed by one or more of a plurality computer processing systems. A distributed computer environment also includes an Internet of things computing environment for example where a computer processing systems are distributed in a network of objects that can interact with a computing service.

Computer processing system 10 may be described in the general context of computer system-executable instructions, such as program modules, being executed by a computer processor. Generally, program modules may include routines, programs, objects, components, logic, and data structures that perform particular tasks or implement particular abstract data types. Computer processing system 10 may be embodied in distributed cloud computing environments where tasks are performed by remote processing devices that are linked through a communications network. In a distributed cloud computing environment, program modules may be located in both local and remote computer system storage media including memory storage devices.

Computer processing system 10 comprises: general-purpose computer server 12 and one or more input devices 14 and output devices 16 directly attached to the computer server 12. Computer processing system 10 is connected to a network 20. Computer processing system 10 communicates with a user 18 using input devices 14 and output devices 16. Input devices 14 include one or more of: a keyboard, a scanner, a mouse, trackball or another pointing device. Output devices 16 include one or more of a display or a printer. Computer processing system 10 communicates with network devices (not shown) over network 20. Network 20 can be a local area network (LAN), a wide area network (WAN), or the Internet.

Computer server 12 comprises: central processing unit (CP) 22; network adapter 24; device adapter 26; bus 28 and memory 30.

CPU 22 loads machine instructions from memory 30 and performs machine operations in response to the instructions. Such machine operations include: incrementing or decrementing a value in a register; transferring a value from memory 30 to a register or vice versa; branching to a different location in memory if a condition is true or false (also known as a conditional branch instruction); and adding or subtracting the values in two different registers and loading the result in another register. A typical CPU can perform many different machine operations. A set of machine instructions is called a machine code program, the machine instructions are written in a machine code language which is referred to a low level language. A computer program written in a high level language needs to be compiled to a machine code program before it can be run. Alternatively a machine code program such as a virtual machine or an interpreter can interpret a high level language in terms of machine operations.

Network adapter 24 is connected to bus 28 and network 20 for enabling communication between the computer server 12 and network devices.

Device adapter 26 is connected to bus 28 and input devices 14 and output devices 16 for enabling communication between computer server 12 and input devices 14 and output devices 16.

Bus 28 couples the main system components together including memory 30 to CPU 22. Bus 28 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Memory 30 includes computer system readable media in the form of volatile memory 32 and non-volatile or persistent memory 34 which may include, in one embodiment, read-only (ROM). Examples of volatile memory 32 are random access memory (RAM) 36 and cache memory 38. Generally volatile memory is used because it is faster and generally non-volatile memory is used because it will hold the data for longer. Computer processing system 10 may further include other removable and/or non-removable, volatile and/or non-volatile computer system storage media. By way of example only, persistent memory 34 can be provided for reading from and writing to a non-removable, non-volatile magnetic media (not shown and typically a magnetic hard disk or solid-state drive). Although not shown, further storage media may be provided including: an external port for removable, non-volatile solid-state memory; and an optical disk drive for reading from or writing to a removable, non-volatile optical disk such as a compact disk (CD), digital video disk (DVD) or Blu-ray. In such instances, each can be connected to bus 28 by one or more data media interfaces. As will be further depicted and described below, memory 30 may include at least one program product having a set (for example, at least one) of program modules that are configured to carry out the functions of embodiments of the invention.

The set of program modules configured to carry out the functions of the embodiment comprises wall encoding and decoding module 200. In one embodiment, ROM in the memory 30 stores module 200 that enables the computer server 12 to function as a special purpose computer specific to the module 200. Further program modules that support the embodiment but are not shown include firmware, boot strap program, operating system, and support applications. Each of the operating system, support applications, other program modules, and program data or some combination thereof, may include an implementation of a networking environment.

Computer processing system 10 communicates with at least one network 20 (such as a local area network (LAN), a general wide area network (WAN), and/or a public network like the Internet) via network adapter 24. Network adapter 24 communicates with the other components of computer server 12 via bus 28. It should be understood that although not shown, other hardware and/or software components could be used in conjunction with computer processing system 10. Examples, include, but are not limited to: microcode, device drivers, redundant processing units, external disk drive arrays, redundant array of independent disks (RAID), tape drives, and data archival storage systems.

Referring to FIG. 2, wall encoding and decoding module 200 comprises the following components: a register for storing a cellular space definition data 202; a register for storing brick definition data 203; character reading and writing engine 204; brick validation engine 206; loop facilitator 208; serialization de-serialization engine 210; wall encoding method 300 and wall decoding method 400.

Cellular space definition data 202 is stored in a register and is for defining the cellular data structure for the encoding and decoding method. In the example the cellular data structure is a two dimension orthogonal matrix but other dimensions and coordinate systems can be used.

Brick definition data 203 is stored in register and is for defining the structure of a brick.

Character reading and writing engine 204 is for reading characters from and writing characters to the cellular data structure.

Brick validation engine 206 is for testing if a particular value in a particular cell in the cellular data structure will lead to an invalid group of cells within the data structure, that is for testing if a particular value in a particular cell in the data structure will lead to an invalid brick (one that does not conform to the definition of a brick). Brick validation engine 206 is also for determining if a valid brick has been formed after a new value has been written to the data structure.

Loop facilitator 208 is for looping between the character reading and writing engine 204 and the brick validation engine 206 when there are characters in the input string. The loop facilitator 208 is also for incrementing a counter (n) so that the next binary character in the input string IS(n) is considered for the next position CP(n) in the data structure.

Serialization de-serialization engine 210 is for serializing and de-serializing the two dimensional shape into and from serial data.

Wall encoding method 300 controls the main coding process.

Wall decoding method 400 controls the main decoding process.

Figure 3B:
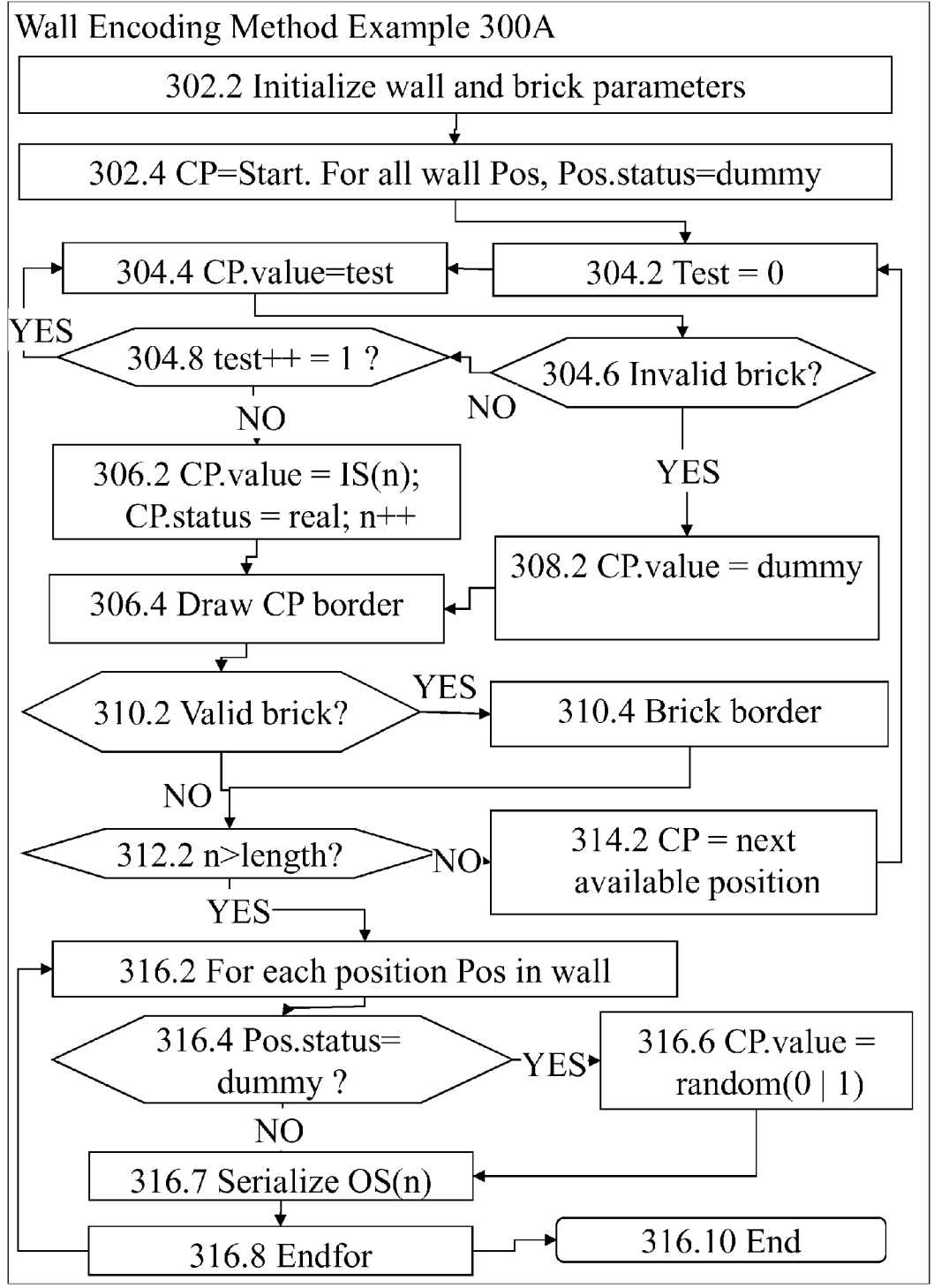
FIG. 3B is a flow diagram of an example process.

Referring to FIG. 3A, wall encoding method 300 comprises logical process steps 302 to 316 of the embodiment with corresponding more details logical process steps 302.2 to 316.10 with respect to FIG. 3B. Wall encoding method 300 starts when a user selects some text or data in an input string and then selects that wall encoding method 300 be executed on the selected text.

Step 302 is for defining a cellular data structure and brick including a starting empty cell. For example a matrix data structure would be defined by the following parameters: matrix width (MW); matrix height (MH); initial position (IPos); current position (CP); and string size (SS). Initial position is typically set to n=1 but it can be set to any possible value of n. Each position of the matrix is identified with an index in an index table. The matrix is filled bit by bit, following the sequence of input bits, starting with an initial position (IPos). A brick definition can define the number of cells in a brick as two, three, four, more than four, or between two and four. The equivalent steps in the example are step 302.2 and step 302.4.

Step 304 is for testing the data structure at an empty cell (beginning with the empty starting cell) with binary values (0 and 1) for invalid brick formation. If either binary value results in an invalid brick then step 308. However, if both values may be written without invalidating any bricks then step 306. For instance, if "1" is placed in the empty cell testing if this will result in a group of "0" cells being formed that do not conform to the brick definition. Alternately, if "0" is placed in the empty cell, testing if this will result in a group of "1" cells being formed that do not conform to the brick definition. If a group of two cells is formed and the brick definition is for three or more cells then an invalid brick would be formed. Referring to FIG. 3B, step 304.2 sets a test value at zero (Test=0), step 304.4 temporarily sets the wall position to the test value (CP.value=test). Step 304.6 (Invalid Brick?) is for branching to step 308.2 if the cells test for an invalid brick using the brick conditions otherwise the process continues at step 304.8. Step 304.8 (test++=1?) is for incrementing the test value and branching to step 304.4 if the value is 1 otherwise branching to step 306.2.

Step 306 is for writing an input string value into the current cell. Step 306 is also for updating the cell status (full or busy from idle or empty) and for updating the index value. Referring to FIG. 3B, step 306.2 is for setting the current position value (CP.value) equal to the $n^{th}$ binary character of input string (IS(n)). Step 306.4 is for drawing a border around a newly formed brick if that has happened—other embodiments may change the status of filled cells to show that they are filled cells that are part of a brick. This is needed for the brick validity test which is only performed on cells that are not already in a brick.

Step 308 is for updating a cell value with a dummy value for a cell determined as potential creating an invalid brick determining a next cell by methodically checking cells along the paths in the data structure until a cell is located. This is illustrated in step 308.2 as current position value (CP.value) equal to dummy.

Step 310 is for updating respective cell statuses to brick statuses (e.g. a brick no. 2 status) if a valid brick has been built in the previous step. This is illustrated by step 310.2 and 310.4 drawing a border around a brick. Drawing border and setting cell status for respective brick cells are different ways of identifying bricks in the wall.

Step 312 is for branching to step 314 if the input string is not finished. Else step 316. This is illustrated by step 312.2 by comparing the string index n with length being the length of the string.

Step 314 is for incrementing the cell index. Next step 304. This is illustrated by step 314.2 where the current position (CP) is set to the next available position.

Step 316 is for methodically serializing the data structure into a binary string of characters representing an encoded string of alphanumeric characters. This may be performed simply using left to right/top to bottom path or a top to bottom/left right path or a diagonal path or a more meandering path through the data structure. Step 316 is also for, optionally, randomizing the dummy values. Step 316 is also the end step in process 300. Step 316 is illustrated by: step 316.2 setting up a loop for each position (POS) in the wall; step 316.4 is for branching to step 316.6 if the cell position status is a dummy value else step 316.7; step 316.7 is for serializing the output string (OS(n)) for each character; step 316.8 maintains the loops back to step 316.2 for each position on the wall; 316.10 is the end of process 300A. This is the end of method 300.

Figure 4B:
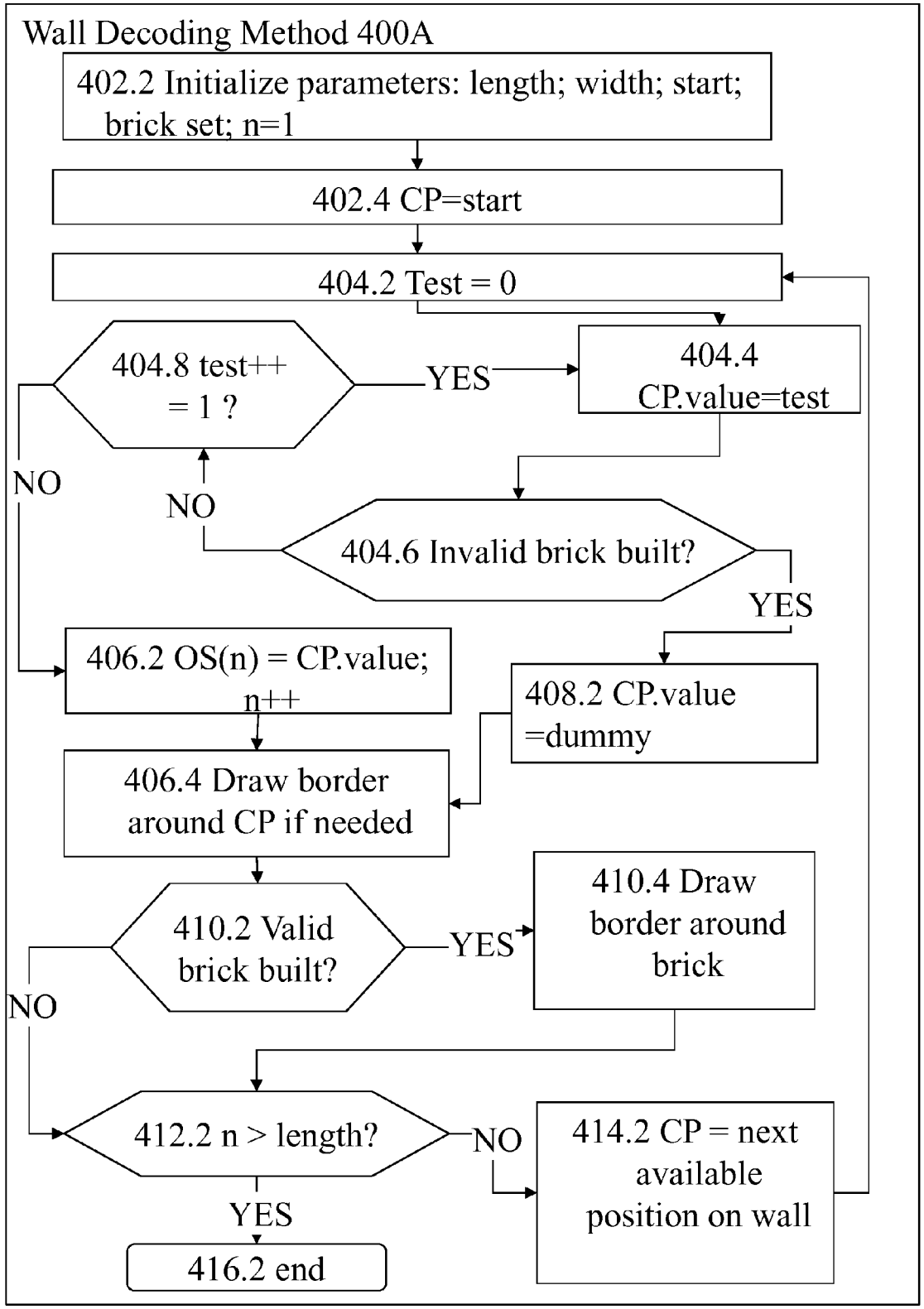
FIG. 4B is an example process diagram.

Referring to FIG. 4A, wall decoding method 400 comprises logical process steps 402 to 416 of the embodiment with corresponding more detailed logical process steps 402.2 to 416.2 with respect to FIG. 4B. Wall decoding method 400 starts when a user selects some encoded text in an input string and then selects that wall decoding method 400 be executed on the selected text to produce a decoded output string.

Step 402 is for defining a cellular data structure including an empty starting current cell and a brick definition. As illustrated by step 402.2 parameters initialized include: length; width; start; brick set; and input string index n=1. Step 402.4 is for setting the current position (CP) to start.

Step 403 is for methodically filling the cellular data structure with a binary string of characters representing an encoded string of alphanumeric characters. All cell statuses are set to busy (or full).

Step 404 is for testing the data structure at an empty cell with binary values for invalid brick formation. The first cell tested is the first empty cell but then subsequent empty cells are tested. This is illustrated in FIG. 4A. Step 404.2 is for setting a test variable to zero. Step 404.4 is for setting the current position value (CP.value) to the text variable (initially zero). Step 404.6 is for branching to step 408.2 if an invalid brick has been built, else step 404.8. Step 404.8 is for incrementing the test variable (from zero to one) and proceeding to step 404.4 if so, otherwise step 406.2.

Step 406 is for writing the current cell of the data structure into an output string at an output string index. Step 406 is also for updating the cell status to idle and also updating the output string index. This is illustrated by step 406.2 setting the output string (OS(n)) to equal the current position value (CP.value). Step 406 also increments the output string index (n++). Step 406.4 is for drawing a border around the current position (CP) if needed.

Step 408 is for updating the cell value with dummy value. This is illustrated with step 408.2 updating the current position (CP.value) to a dummy value.

Step 410 is for updating the cell status to brick status (bordered) if a valid brick has been built. This is illustrated by step 410.2 testing if a valid brick has been built, and by step 410.4 drawing a border around the brick if this is the case.

Step 412 is for branching to step 414 if the input string is finished, otherwise the method ends at step 416. This is illustrated by step 412.2 checking if the output string index n is more than a length variable.

Step 414 is for incrementing the cell index. This is illustrated by step 414.2 where the current position (CP) is set to the next available position on the wall.

Step 416 is the end of wall decoding method 400.

Figure 5A:
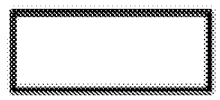
FIGS. 5A, 5B and 5C are diagrams of three different example brick sets.

Referring to FIG. 5A, an example two cell sized brick is illustrated (domino bricks).

Figure 5B:
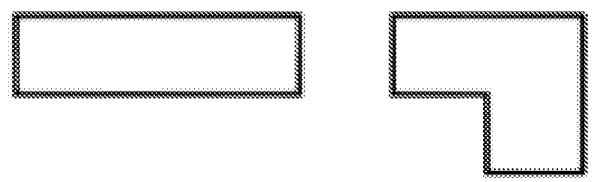

Referring to FIG. 5B, three cell sized example bricks are illustrated. One example has all the cells in a line and the other example has an L shaped configuration of cells.

Figure 5C:
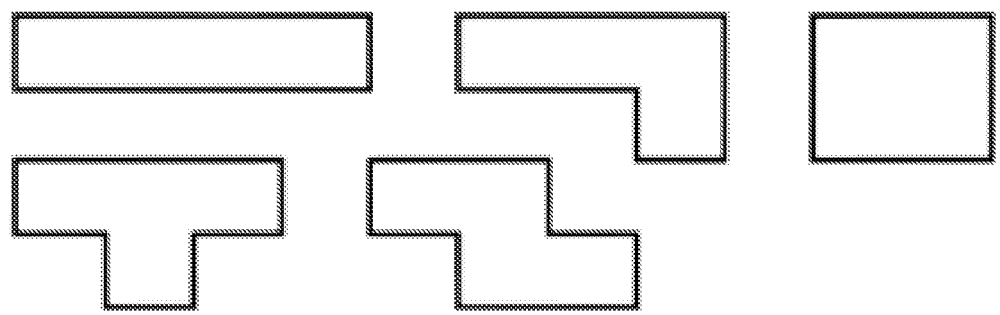

Referring to FIG. 5C, four cell sized example bricks are illustrated.

Figure 6A:
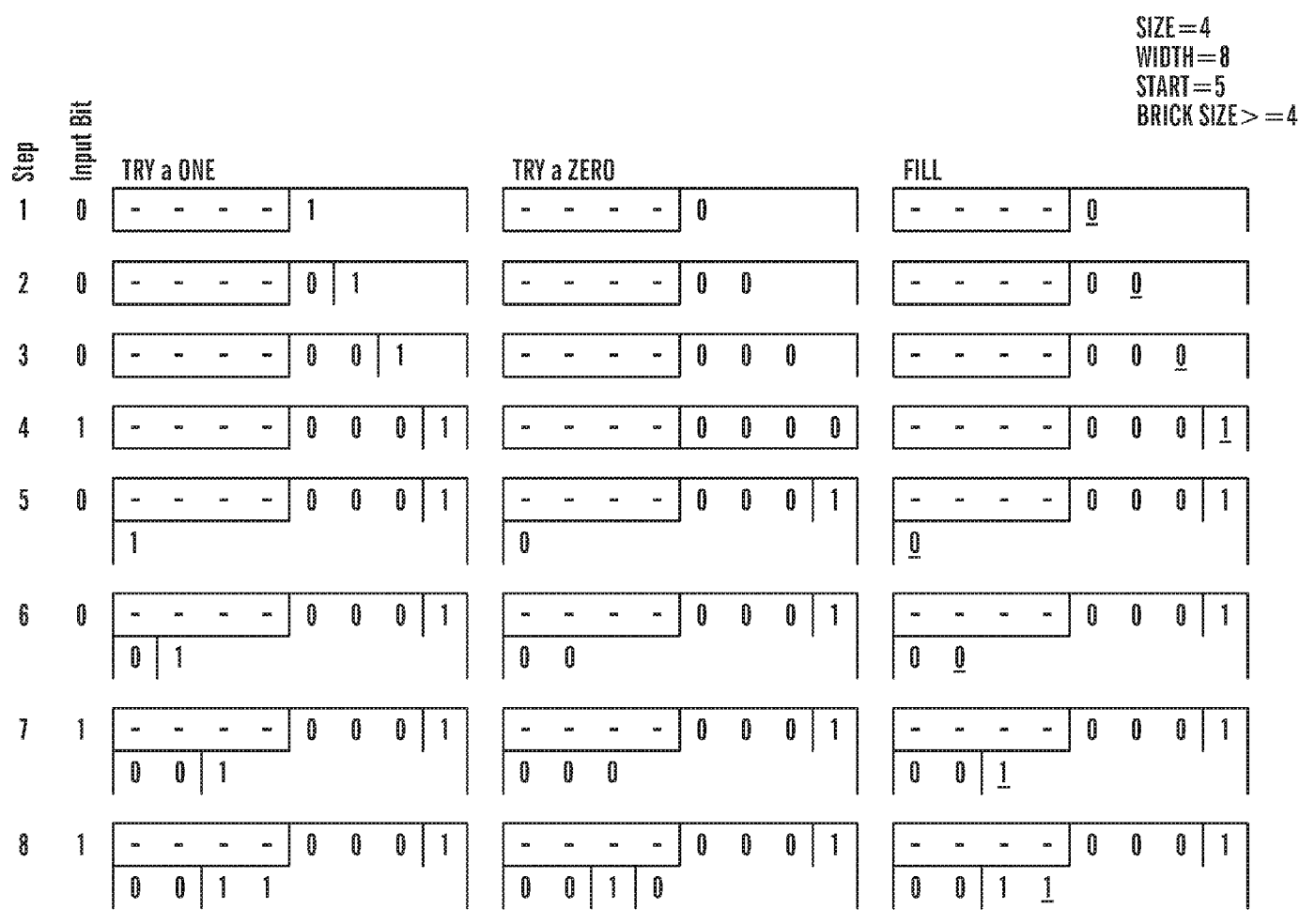
Figure 6B:
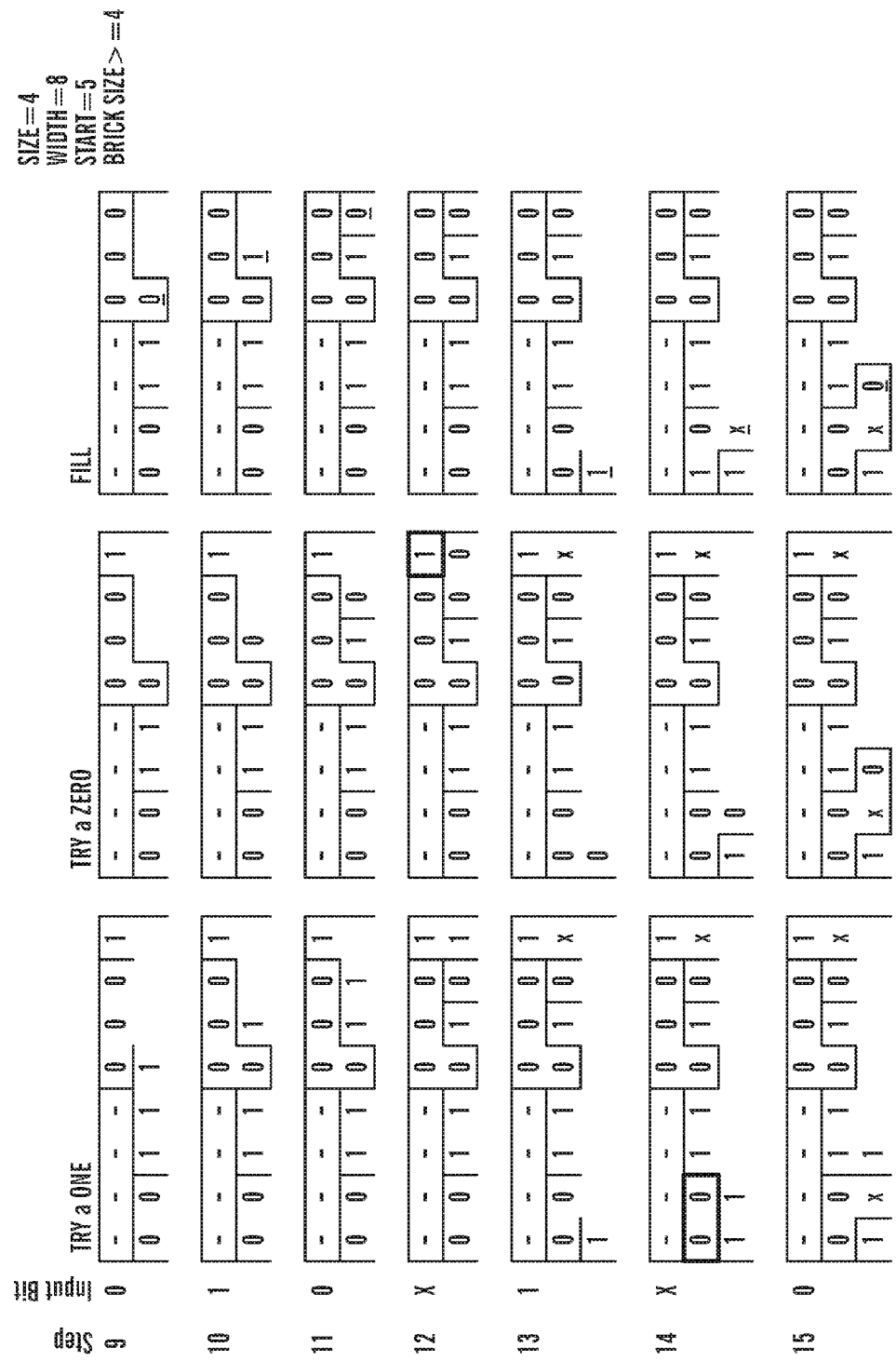
Figure 6C:
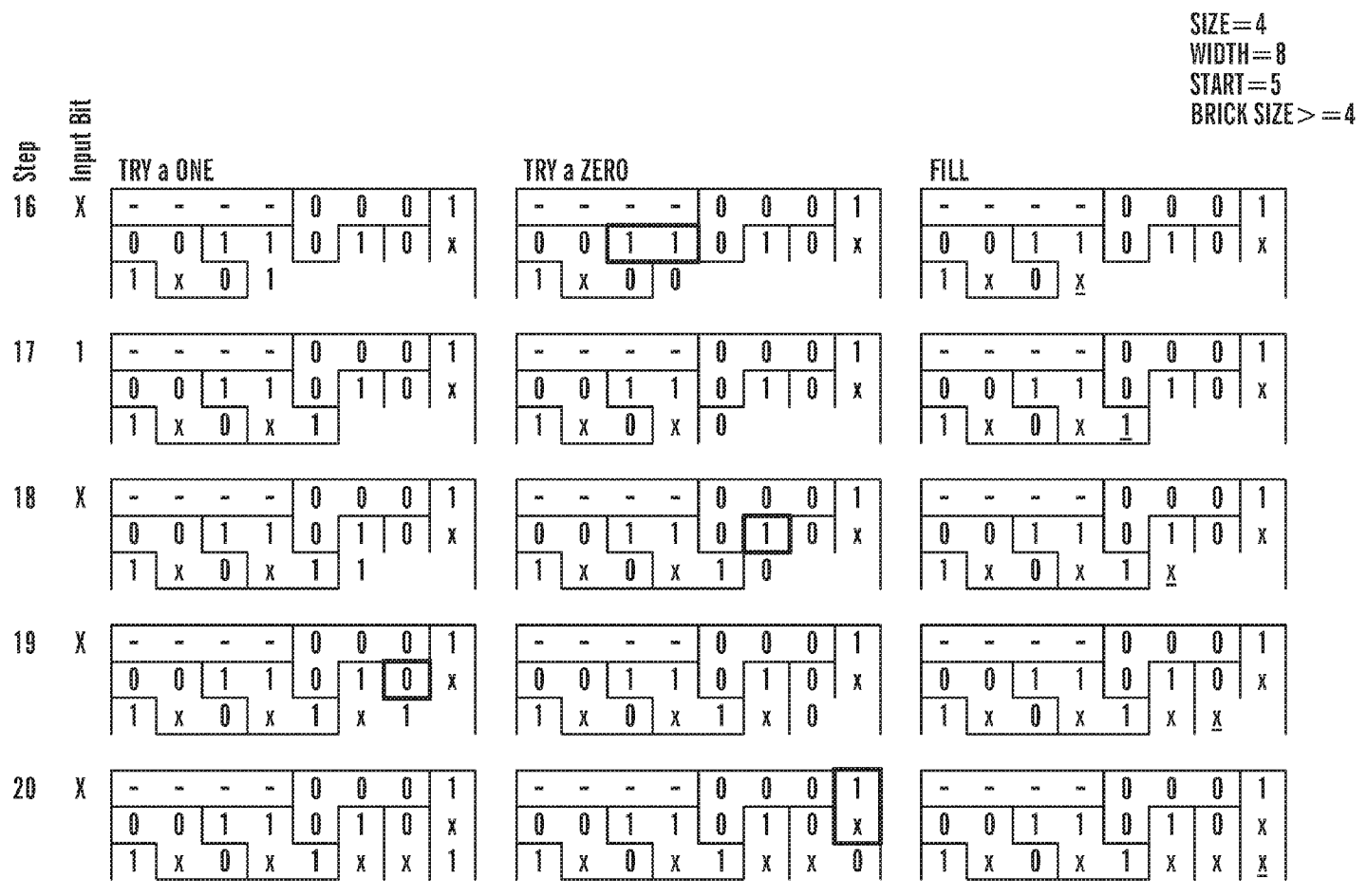

FIGS. 6A, 6B and 6C is a table showing how an example input stream of twenty binary characters is written into a wall step by step.

At each step a zero and a one are tested on the current position.

For the steps 1 to 10 inclusive, neither value leads to an invalid brick, so that the input string bit fills the wall.

At step 9 a first valid brick is formed and is bordered.

At each step a zero and a one are tested on the current position.

For step 12, the value zero leads to an invalid brick (one single cell brick shown in a double lined border), so a dummy value x (for 1) is placed to fill the current position (right end of second row).

For step 14, the value one leads to an invalid brick (a two cell brick shown in a double lined border), so that a dummy value x (for 0) is placed to fill the current position (third row and second position from the left side of the wall).

Similar situations occur at steps 14, 16, 18, 19 and 20. The process continues until the input string is finished (see FIG. 7A).

Referring to FIG. 7A there is shown an example wall after writing an example input string comprising a table of width eights cells.

Referring to 7B, a table shows example initial parameters used to code the example wall. The length of the input string is forty eight characters, the width of the table is eight characters, the cell start position is the fifth cell; and the brick set is a group of four or more same value cells (size>=4).

Figure 7D:
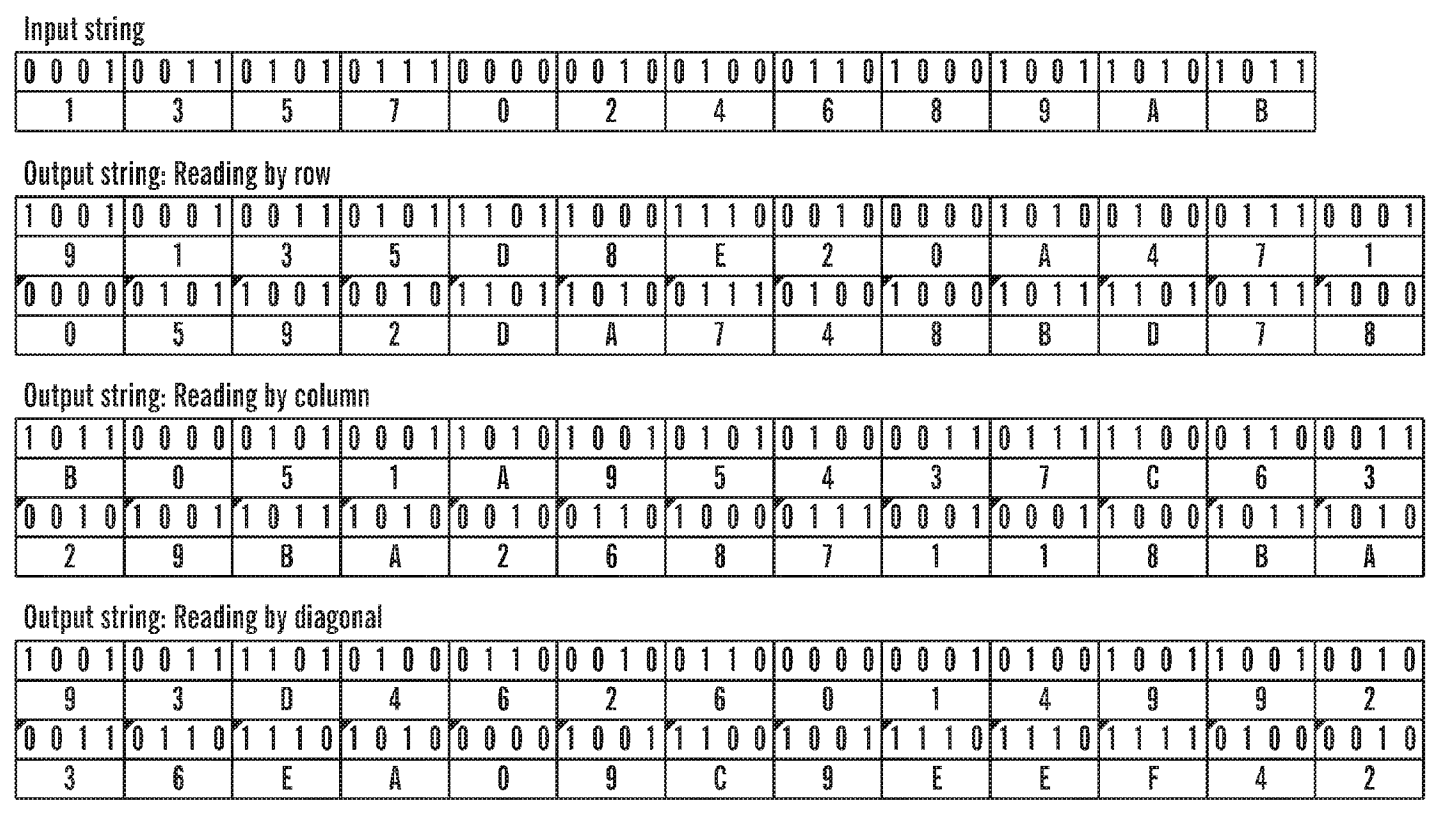

Referring to FIG. 7C, a table showing the example input string and three different possible output strings for the example. For example reading characters by row or by column or diagonally renders three different output strings as can be seen in more detail in FIG. 7D.

Referring to FIG. 7D, a table showing the binary characters from the wall making up the three possible output strings. The first set of rows comprise the input string in binary and a hexadecimal version. The second set of rows comprises the output string in binary reading row by row and a respective hexadecimal conversion. The third set of rows comprises the output string in binary reading by column and a respective hexadecimal version. The fourth set of rows comprise the output string in binary reading diagonally and a respective hexadecimal version.

FIGS. 8A, 8B, 8C, and 8D show four different transmitted tables of the same output string. The completely bordered cells are all dummy cells and have been randomized in each of the four figures.

FIGS. 9A, 10A, 11A, 12A, and 13A are different examples of a wall after writing an input string.

FIGS. 9B, 10B, 11B, 12B and 13B are respective examples of a table showing initial parameters used to code the example walls.

FIGS. 9C, 100, 11C, 12C and 13C are respective example of a table showing the input string and three different possible output strings.

Referring to FIGS. 9A, 9B and 9C, there is shown a wall having a brick defined as four cells.

Referring to FIGS. 10A, 10B and 10C there is shown a wall having bricks comprising three or more cells.

Referring to FIGS. 11A, 11B and 11C there is shown a wider wall (nine cells wide) having a different start position (start position seven cells along).

Referring to FIGS. 12A, 12B and 12C there is shown a wall comprising domino bricks (double cell sized bricks).

Referring to FIGS. 13A, 13B and 13C there is shown a non-uniform wall.

Further embodiments of the invention are now described.

It will be clear to one of ordinary skill in the art that all or part of the logical process steps of the embodiment may be alternatively embodied in a logic apparatus, or a plurality of logic apparatus, comprising logic elements arranged to perform the logical process steps of the method and that such logic elements may comprise hardware components, firmware components or a combination thereof.

It will be equally clear to one of skill in the art that all or part of the logic components of the embodiment may be alternatively embodied in logic apparatus comprising logic elements to perform the steps of the method, and that such logic elements may comprise components such as logic gates in, for example, a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In a further alternative embodiment, the present invention may be realized in the form of a computer implemented method of deploying a service comprising steps of deploying computer program code operable to, when deployed into a computer infrastructure and executed thereon, cause the computer system to perform all the steps of the method.

It will be appreciated that the method and components of the embodiment may alternatively be embodied fully or partially in a parallel computing system comprising two or more processors for executing parallel software.

A further embodiment of the invention is a computer program product defined in terms of a system and method. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (for example, light pulses passing through a fibre-optic cable), or electrical signals transmitted through a wire.

Computer-readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibres, wireless transmission, routers, firewalls, switches, gateway computers and/or edge servers. A network adapter card or network interface in each computing/processing device receives computer-readable program instructions from the network and forwards the computer-readable program instructions for storage in a computer readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, or either source code or object code written in any combination of one or more programming languages, including an object oriented programming language such as Smalltalk, C++ or the like, and conventional procedural programming languages, such as the C programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be clear to one skilled in the art that many improvements and modifications can be made to the foregoing exemplary embodiment without departing from the scope of the present invention.

The invention claimed is:
1. A system for encoding an input string of binary characters, comprising:
   a register for storing a cellular data structure definition, the cellular data structure including a starting empty cell;
   a register for storing a group cell structure definition for a valid brick formation;
   a brick validation engine for testing data structure at a current cell beginning with the starting empty cell for an invalid brick formation;

a character reading and writing engine for writing, if the empty cell is not invalid, a binary character from the input string to the empty cell and writing, if the empty cell is invalid, a dummy value to the empty cell;

a loop facilitator for looping back through the testing and writing steps with a next data character and a next empty cell until there are no more data characters; and a serialization de-serialization engine for methodically serializing the data structure into a one dimensional binary string of characters representing an encoded string of alphanumeric characters.

2. A system according to claim 1, wherein the group cell structure definition for a valid brick formation requires cell values for a brick to have the same value.

3. A system as according to claim 1, wherein the group cell structure definition for a valid brick formation comprises a condition for the number of cells in a brick.

4. A system according to claim 1, further comprising randomizing dummy cell values before serialization.

5. A system according to claim 1, wherein the data structure is an array and the dimensions include length and width.

6. A system according to claim 1, wherein the cellular definition includes an order and path in which the cells of the cellular data structure are written to and read from.

7. A system according to claim 1, further comprising updating cells status when a valid brick has been formed.

8. A system for decoding an input string of binary characters representing an encoded string of alphanumeric characters, comprising:

a register for storing a cellular data structure definition, the cellular structure definition including: a starting empty cell; a group cell definition for a valid brick formation and a de-serializing method;

a serialization de-serialization engine for de-serializing a binary string of characters representing the encoded string of alphanumeric characters into the cellular data structure using the de-serializing method;

a brick validation engine for testing data structure at a current cell beginning with the starting empty cell for an invalid brick formation;

a character reading and writing engine for reading, if the empty cell is not invalid, a binary character from the empty cell to an output string; and a loop facilitator for looping back through the testing and reading steps with a next empty cell until there are no more data characters.

9. A method of encoding an input string of binary characters, comprising:

defining a cellular data structure including a starting empty cell;

defining a group cell structure for a valid brick formation;

testing data structure at a current cell beginning with the starting empty cell for an invalid brick formation;

writing, if the empty cell is not invalid, a binary character from the input string to the empty cell;

writing, the if empty cell is invalid, a dummy value to the empty cell;

looping back through the testing and writing steps with a next data character and a next empty cell until there are no more data characters; and methodically serializing the data structure into a one dimensional binary string of characters representing an encoded string of alphanumeric characters.

10. A method according to claim 9, wherein the group cell structure definition for a valid brick formation requires cell values for a brick to have the same value.

11. A method according to claim 9, wherein the group cell structure definition for a valid brick formation comprises a condition for the number of cells in a brick.

12. A method according to claim 9, further comprising randomizing dummy cell values before serialization.

13. A method according to claim 9, wherein the data structure is an array and the dimensions include length and width.

14. A method according to claim 9, wherein the cellular structure definition includes an order and path in which the cells of the cellular data structure are written to and read from.

15. A method according to claim 9, further comprising updating cells status when a valid brick has been formed.

16. A method of decoding an input string of binary characters representing an encoded string of alphanumeric characters, comprising:

receiving a cellular data structure definition; a starting empty cell; a group cell definition for a valid brick formation and a de-serializing method;

de-serializing a binary string of characters representing the encoded string of alphanumeric characters into the cellular data structure using the de-serializing method;

testing data structure at a current cell beginning with the starting empty cell for an invalid brick formation;

reading, if the empty cell is not invalid, a binary character from the empty cell to an output string; and looping back through the testing and reading steps with a next empty cell until there are no more data characters.

17. A computer program product comprising a computer-readable storage medium having computer-readable program code embodied therewith, the computer-readable program code configured to perform a method for encoding an input string of binary characters representing alphanumeric characters when executed by a computer system, the method comprising:

defining a group cell structure for a valid brick formation;

testing data structure at a current cell beginning with the starting empty cell for an invalid brick formation;

writing, if empty cell is not invalid, a binary character from the input string to the empty cell;

writing, if empty cell is invalid, a dummy value to the empty cell;

looping back through the testing and writing steps with a next data character and a next empty cell until there are no more data characters; and methodically serializing the data structure into a one dimensional binary string of characters representing an encoded string of alphanumeric characters.

* * * * *